(12) United States Patent
Kim et al.

(10) Patent No.: US 9,552,244 B2
(45) Date of Patent: Jan. 24, 2017

(54) REAL TIME CORRECTION OF BIT FAILURE IN RESISTIVE MEMORY

(71) Applicant: QUALCOMM Incorporated, San Diego, CA (US)

(72) Inventors: Taehyun Kim, San Diego, CA (US); Sungryul Kim, San Diego, CA (US); Jung Pill Kim, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 162 days.

(21) Appl. No.: 14/150,559

(22) Filed: Jan. 8, 2014

(65) Prior Publication Data

US 2015/0194201 A1 Jul. 9, 2015

(51) Int. Cl.
| | |
|---|---|
| G06F 11/07 | (2006.01) |
| H03M 13/05 | (2006.01) |
| G06F 11/10 | (2006.01) |
| G11C 29/00 | (2006.01) |
| G11C 29/04 | (2006.01) |

(52) U.S. Cl.
CPC ....... G06F 11/0766 (2013.01); G06F 11/1008 (2013.01); G11C 29/808 (2013.01); G11C 29/814 (2013.01); H03M 13/05 (2013.01); G11C 2029/0411 (2013.01)

(58) Field of Classification Search
CPC ....... G11C 29/44; G11C 29/70; G11C 29/808; G11C 2029/0411; G06F 11/0766; G06F 11/1008
See application file for complete search history.

(56) References Cited

U.S. PATENT DOCUMENTS

| | | | | |
|---|---|---|---|---|
| 4,875,212 A | * | 10/1989 | Hashimoto | .................. 714/764 |
| 5,999,463 A | * | 12/1999 | Park | ........................ G06F 11/00 |
| | | | | 365/200 |
| 7,415,640 B1 | * | 8/2008 | Zorian et al. | ................. 714/711 |
| 8,032,816 B2 | | 10/2011 | Spanel et al. | |
| 8,040,743 B2 | * | 10/2011 | Huang et al. | ............ 365/189.14 |

(Continued)

OTHER PUBLICATIONS

Panagopoulos, G.; Augustine, C.; Roy, K., "Modeling of dielectric breakdown-induced time-dependent STT-MRAM performance degradation," Device Research Conference (DRC), 2011 69th Annual , vol., No., pp. 125,126, Jun. 20-22, 2011.*

(Continued)

Primary Examiner — Steve Nguyen
(74) Attorney, Agent, or Firm — Muncy, Geissler, Olds & Lowe, P.C.

(57) ABSTRACT

Systems and methods for correcting bit failures in a resistive memory device include dividing the memory device into a first memory bank and a second memory bank. A first single bit repair (SBR) array is stored in the second memory bank, wherein the first SBR array is configured to store a first indication of a failure in a first failed bit in a first row of the first memory bank. The first memory bank and the first SBR array are configured to be accessed in parallel during a memory access operation. Similarly, a second SBR array stored in the first memory bank can store indications of failures of bits in the second memory bank, wherein the second SBR array and the second memory bank can be accessed in parallel. Thus, bit failures in the first and second memory banks can be corrected in real time.

19 Claims, 18 Drawing Sheets

(56) References Cited

U.S. PATENT DOCUMENTS

| | | | |
|---|---|---|---|
| 8,086,913 B2* | 12/2011 | Houg | 714/710 |
| 8,467,258 B2 | 6/2013 | Lin et al. | |
| 2001/0054165 A1* | 12/2001 | Ono | G11C 29/789 |
| | | | 714/718 |
| 2004/0015754 A1 | 1/2004 | Callaway et al. | |
| 2005/0128830 A1 | 6/2005 | Nishihara et al. | |
| 2008/0320346 A1* | 12/2008 | Lin | G06F 11/1072 |
| | | | 714/721 |
| 2009/0132876 A1* | 5/2009 | Freking et al. | 714/723 |
| 2011/0296258 A1 | 12/2011 | Schechter et al. | |
| 2012/0030441 A1* | 2/2012 | Yamashita | 711/162 |
| 2012/0173921 A1* | 7/2012 | Wuu et al. | 714/6.21 |
| 2012/0182803 A1 | 7/2012 | Shirakawa | |
| 2012/0266043 A1* | 10/2012 | Nakura | G11C 13/0007 |
| | | | 714/763 |
| 2013/0117620 A1 | 5/2013 | Joo et al. | |
| 2013/0151912 A1* | 6/2013 | Sevugapandian | G06F 11/006 |
| | | | 714/704 |
| 2013/0332801 A1* | 12/2013 | Weng | G06F 11/1008 |
| | | | 714/773 |

OTHER PUBLICATIONS

International Search Report and Written Opinion—PCT/US2014/069984—ISA/EPO—Apr. 10, 2015.

* cited by examiner

SBR repair process (during refresh)

SBR repair process (during refresh)

Fail bit aware write (fail bit write value different from pre-read value)

… (1)

REAL TIME CORRECTION OF BIT FAILURE IN RESISTIVE MEMORY

FIELD OF DISCLOSURE

Disclosed embodiments are directed to detection and correction of bit failures in resistive memory. More specifically, exemplary embodiments are directed to real time repair of soft or hard failures of bits of a resistive memory array, such as, Magnetoresistive Random Access Memory (MRAM), based on a single bit repair (SBR) array simultaneously accessible with the resistive memory array.

BACKGROUND

Hard and soft failures are common in memory cells of resistive memory devices. Such failures are seen, for example, in magnetoresistive random access memory (MRAM), which is a non-volatile memory technology that uses magnetic elements. More specifically, MRAM comprises magnetic tunnel junction (MTJ) cells, which include a barrier layer separating a pinned layer and a free layer. The polarization of the free layer can be reversed by applying current in a specific direction such that the polarity of the pinned layer and the free layer are either substantially aligned or opposite. The resistance of the electrical path through the MTJ varies depending on the alignment of the polarizations of the pinned and free layers. This variation in resistance can be used to program and read the MTJ cells, as is known in the art.

The barrier layer is typically a thin insulating layer formed from materials such as, MgO, which is susceptible to breakdowns. Particularly, the barrier layer can easily breakdown under relatively small stress levels as device technology advances and the size of MTJ cells shrink. Such breakdown can lead to hard failures which cannot be easily repaired due to permanent or long term damage, as opposed to soft failures which are easily repairable.

In particular, irreparable or hard failures require replacement of failed cells. However, it is not feasible to replace individual bit cells in memory arrays once the memory arrays have been packaged. Thus, rather than replace an entire memory array due to failed bit cells, hard failures are typically dealt with using replacement rows (or columns). In more detail, failure bits of a memory array are first detected; for example, a test macro is run on the memory array to detect failed bit cells. The rows (and/or columns) where the failed bit cells lie, are noted, for example, in a one-time programmable (OTP), and typically, non volatile memory (NVM) array, which is external to the memory array. The OTP NVM array holds information regarding failed rows which comprise failed bit cells.

Replacement rows are then provided for the failed rows. These replacement rows are replicas of entire failed rows, but with failed bit cells replaced with healthy or correctly functioning bit cells. The replacement rows are usually rows of the memory array which have been requisitioned for storing replicas of failed rows in the remainder of the memory array. Since the OTP NVM access time is slow, in practice, the information regarding the failed rows is loaded into fast registers, for example, magnetoresistive random access memory (MRAM) internal registers upon system power up. Thus, every time a memory access is attempted on the memory array, the MRAM internal registers are checked to see if the memory access address is contained therein, in order to ascertain if the desired memory access row is a failed row. If the purported memory access corresponds to a failed row, then the memory access address is rerouted to an address where a corresponding replacement row for the failed row is provided in the memory array. Thus, instead of the failed row, the corresponding replacement row is selected for the memory access.

The above techniques are also extended where ports of the memory array may be damaged, rather than bit cells. For example, if an input/output (TO) port of the memory array is detected to have failed, a replacement IO (or "RIO") is provided. Access addresses which may have required access through a failed IO port are re-routed to a replacement IO. In more detail, in one known implementation, the OTP NVM may be configured to either store a replacement IO for an entire failed IO, such that a replacement IO is obtained from the internal MRAM register, as above, in case a desired access pertains to the failed IO. In another known implementation, the OTP NVM may be configured to store replacement IO information in segments, wherein the memory array may be divided into a plurality of segments (say, n equal segments, for example), with each of the n segments comprising multiple rows. The replacement IO information is created for each of the n segments, such that replacement IO for a particular segment m pertains to failed IO within that segment m. Thus, if segment m has a failed IO, and the desired memory access address falls under segment m, then the corresponding replacement IO can be retrieved only for segment m, rather than retrieving an entire replacement IO. Accordingly, this implementation requires only 1/n of the replacement IO space that is consumed in the OTP NVM, as compared to the previous implementation which stores the entire replacement IO.

Regardless of specific implementations for the OTP NVM that are chosen, the above conventional techniques for dealing with failed bit cells or IOs are deficient in several aspects. Firstly, these techniques are slow and time consuming; and moreover, such techniques cannot be performed on the fly. This is because such techniques require multiple memory array accesses, since at most one row can be accessed at one time in typical memory array designs, and the process of attempting to access a failed row, going through the internal MRAM registers, and then accessing the replacement row or replacement IO incurs multiple clock cycles or in other words, high latency. Secondly, the replacement rows and/or replacement IOs consume valuable space on the memory array, and therefore, the number of replacement rows is typically restricted, thus imposing a restriction on the number of failed rows and/or failed IOs which can be effectively dealt with. Thus, not only are the conventional techniques slow, and unfit for real time repair of failures, the conventional techniques can also lead to inaccuracies where valid replacement rows and/or replacement IOs cannot be provided for all failures.

SUMMARY

Exemplary embodiments are directed to detection and correction of bit failures in resistive memory. More specifically, exemplary embodiments are directed to real time repair of soft or hard failures of bits of a resistive memory array, such as, Magnetoresistive Random Access Memory (MRAM), based on a single bit repair (SBR) array simultaneously accessible with the resistive memory array.

For example, embodiments may pertain to a resistive memory device divided into a first memory bank and a second memory bank. A first single bit repair (SBR) array is stored in the second memory bank, wherein the first SBR array is configured to store a first indication of a failure in a first failed bit in a first row at a first address of the first memory bank. The first memory bank and the first SBR array are configured to be accessed in parallel during a memory access operation. Similarly, a second SBR array stored in the first memory bank can store indications of failures of bits in the second memory bank, wherein the second SBR array and the second memory bank can be accessed in parallel. Thus, bit failures in the first and second memory banks can be corrected in real time.

Accordingly, an exemplary embodiment is directed to a method of correcting bit failures in a memory array, the method comprising: dividing the memory array into a first bank and a second bank, determining a failure in a first failed bit in a first row stored in the first bank, and storing a first indication of the first failed bit in a first single bit repair (SBR) array, wherein the first SBR array is stored in the second bank, to allow parallel access of the first bank and the first SBR array during a memory access operation.

Another exemplary embodiment is directed to a memory device comprising: a first memory bank, a second memory bank, and a first single bit repair (SBR) array stored in the second memory bank, the first SBR array configured to store a first indication of a failure in a first failed bit in a first row of the first memory bank, wherein the first memory bank and the first SBR array are configured to be accessed in parallel during a memory access operation.

Another exemplary embodiment is directed to a memory system comprising: a first memory bank, means for determining a failure in a first failed bit in a first row stored in the first memory bank, and means for storing a first indication of the first failed bit such that the first memory bank and the means for storing are accessible in parallel during a memory access operation.

Yet another exemplary embodiment is directed to a non-transitory computer-readable storage medium comprising code, which, when executed by a processor, causes the processor to perform operations for correcting bit failures in a memory array, the non-transitory computer-readable storage medium comprising: code for determining a failure in a first failed bit in a first row stored in a first memory bank of the memory array, and code for storing a first indication of the first failed bit such that the first memory bank and the means for storing are accessible in parallel during a memory access operation.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Figure 1:
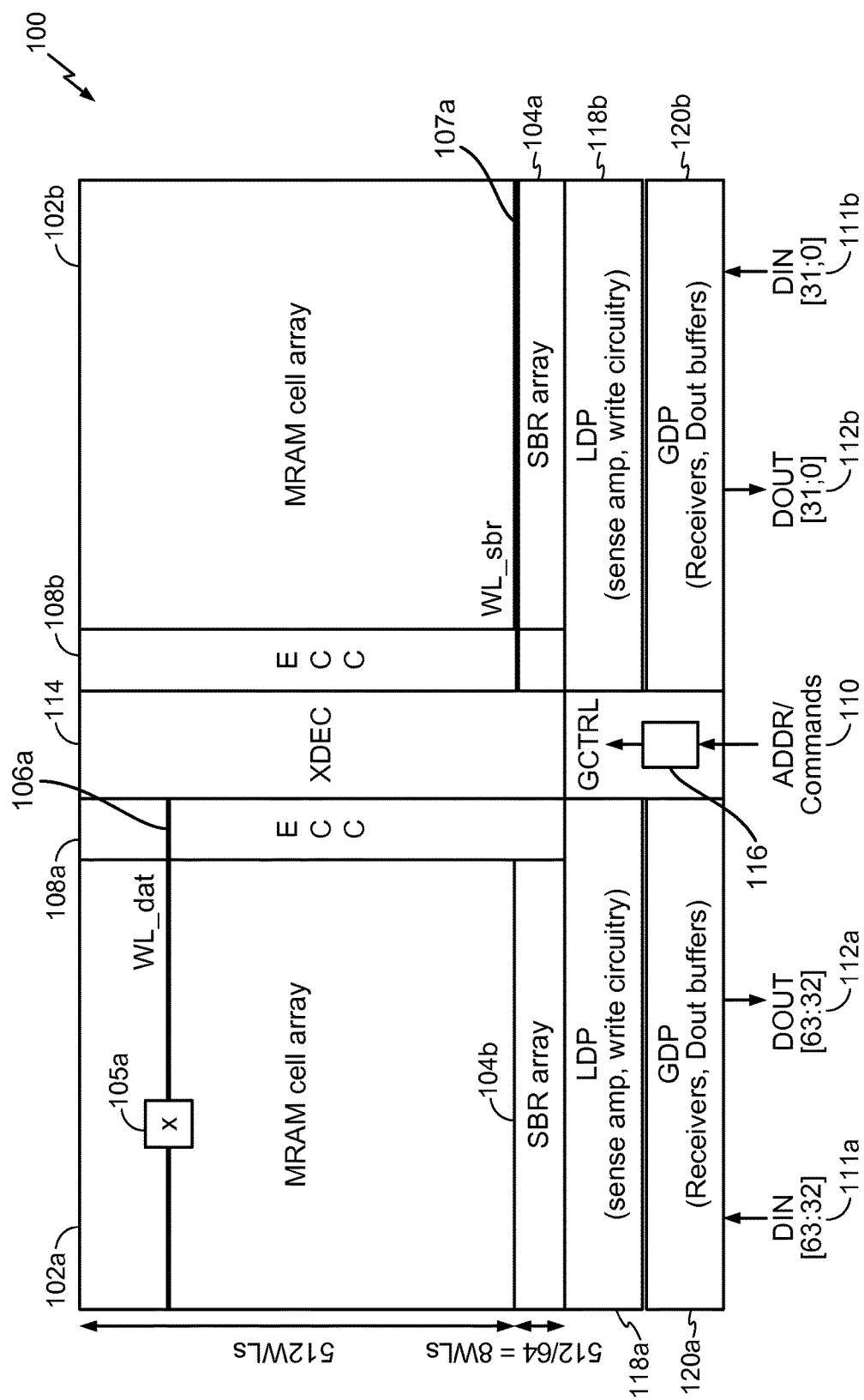
FIG. 1 is an illustration of an exemplary memory device structure configured for real time failed bit repair according to exemplary embodiments.

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments overcome aforementioned deficiencies of conventional techniques for handling failures in memory arrays. Accordingly embodiments include exemplary memory array structures which can be divided into two or more banks. For example, a memory array comprising MRAM cells can be split into a first bank and a second bank. In such a structure, if the memory array were 64-bits wide, then the more significant or upper 32-bits of each row would be stored in the first bank and the less significant or lower 32-bits of the rows would be stored in the second bank. Rather than store an entire replacement row for failed bit rows, for example, as in the conventional techniques, embodiments may be configured to only store addresses of the failed bits in exemplary structures referred to herein as, single bit repair (SBR) arrays. In more detail, an SBR array may include addresses of a bit level granularity, which pinpoint a specific failed bit, rather than an entire failed row which comprises the failed bit. Accordingly, available memory space within the memory array is more efficiently utilized because less storage space is needed to store the address of a failed bit, rather than for storing the entire failed row comprising the failed bit.

In further aspects, a first SBR array corresponding to failed bits of data rows of the first bank can be formed within the second bank of the memory array and a second SBR array corresponding to failed bits of data rows in the second bank can be formed within the first bank. In the exemplary memory array, logic and control means are provided for parallel or simultaneous access of the first bank and second bank, thus enabling parallel access of the first bank, for example, along with its corresponding first SBR array. In this manner, a purported memory access to a first row, for example, of the first bank, can be performed in parallel to accessing the first SBR array from the second bank. Accordingly, embodiments can also improve memory access speed in comparison to conventional techniques.

With reference now, to FIG. 1, a schematic view of an exemplary memory device 100 is illustrated, wherein memory device 100 can be configured to incorporate exemplary aspects related to repair of bit failures, particularly, hard failures. Memory device 100 can be a resistive memory, such as, MRAM, comprising MTJ bit cells, in one embodiment. In more detail, memory device 100 includes a memory array, which is exemplarily 64-bits wide and split into first and second 32-bit wide memory banks, illustrated as first bank 102a and second bank 102b. First SBR array 104a can store addresses pertaining to failed bits in first bank 102a (e.g., first SBR array 104a can store a first address corresponding to a first failed bit in first bank 102a); and similarly, second SBR array 104b can store addresses pertaining to failed bits in second bank 102b. In the illustrated embodiment, memory device 100 can comprise 520 rows, where first bank 102a and second bank 102b comprise 512 rows, and the respective first and second SBR arrays 104a-b comprise 8 rows.

In an example, bit cell 105a of first bank 102a, can be determined as a failed bit, where failed bit 105a can belong to data word line or failed row 106a. Correspondingly, first SBR array 104a can include an entry designated as SBR array entry 107a. SBR array entry 107a can include an address of failed bit 105a, which can comprise a word line offset corresponding to failed row 106a, and a column address (CA) to indicate the bit position of failed bit 105a within failed row 106a. Further, SBR array entry 107a can include a valid bit to indicate whether the address stored relates to a current failure or is obsolete, and an IO number, if there is a failed IO corresponding to failed bit 105a. In some aspects, if failed IOs are determined in a segmented manner as previously described, then the IO number can correspond to the particular segment to which failed row 106a belongs. The number of bits required to represent SBR array entry 107a, for example, are significantly less than the number of bits which may be required to store the entire failed row 106a (as seen in conventional techniques). Thus several entries such as SBR array entry 107a may be stored within each of the 8 rows of first SBR array 104a, for example.

Address commands 110 may be received by memory device 100 for read/write operations, for example, from an external source, such as, a processor or memory controller, (not shown). Global control logic 116 can be configured to receive address commands 110, and decoder 114 is configured to direct accesses pertaining to address commands 110 to concerned rows of first and/or second banks 102a-b. Address commands 110 can include 32-bit operations, as well as, full 64-bit operations, based on particular implementations chosen. For example, a 64-bit write command can include data on both buses DIN 111a [63:32] for the upper 32-bits to first bank 102a, as well as, DIN 111b [31:0] to second bank 102b. Similarly, a 64-bit read command can be used to read out data on DOUT 112a [63:32] for the upper 32-bits from first bank 102a, as well as, DOUT 112b [31:0] from second bank 102b.

In order to assist with reading and writing data, read logic and write logic blocks comprising local data lines (LDP) 118a-b and global data lines (GDP) 120a-b are provided. LDP 118a-b can include read logic or read circuitry comprising sense amplifiers, as well as, write circuitry; and GDP 120a-b can include receivers and data out buffers. In the case of a write operation, write data is received from buses DIN 111a-b by blocks GDP 120a-b and forwarded to LDP 118a-b respectively. Write logic or write circuitry in LDP 118a-b can drive the write data into bit lines of corresponding first and second banks 102a-b respectively. For read operations, the read circuitry comprising the sense amplifiers in LDP 118a-b can sense bit cell data from corresponding first and second banks 102a-b and forward the bit cell data to GDP 120a-b respectively. GDP 120a-b can drive the read data out on to buses DOUT 112a-b.

To assist with determining bit failures, error correction mechanisms can be provided to periodically check the integrity or correctness of data stored within first and second banks 102a-b. To assist in this process, error correcting codes (ECC) bits 106a and 106b are added to each row of first and second banks 102a-b respectively. The functioning of ECC is well known in the art, where redundant ECC bits or parity bits are added to a group of data bits, such that the ECC bits can be used to determine whether one or more errors occurred within the group of data bits. Details of failed bit repair based on the structure of exemplary memory device 100 of FIG. 1, will now be discussed with regard to operations such as, read, write, and/or data scrubbing/refresh illustrated in FIGS. 2A-H.

Figure 2A:
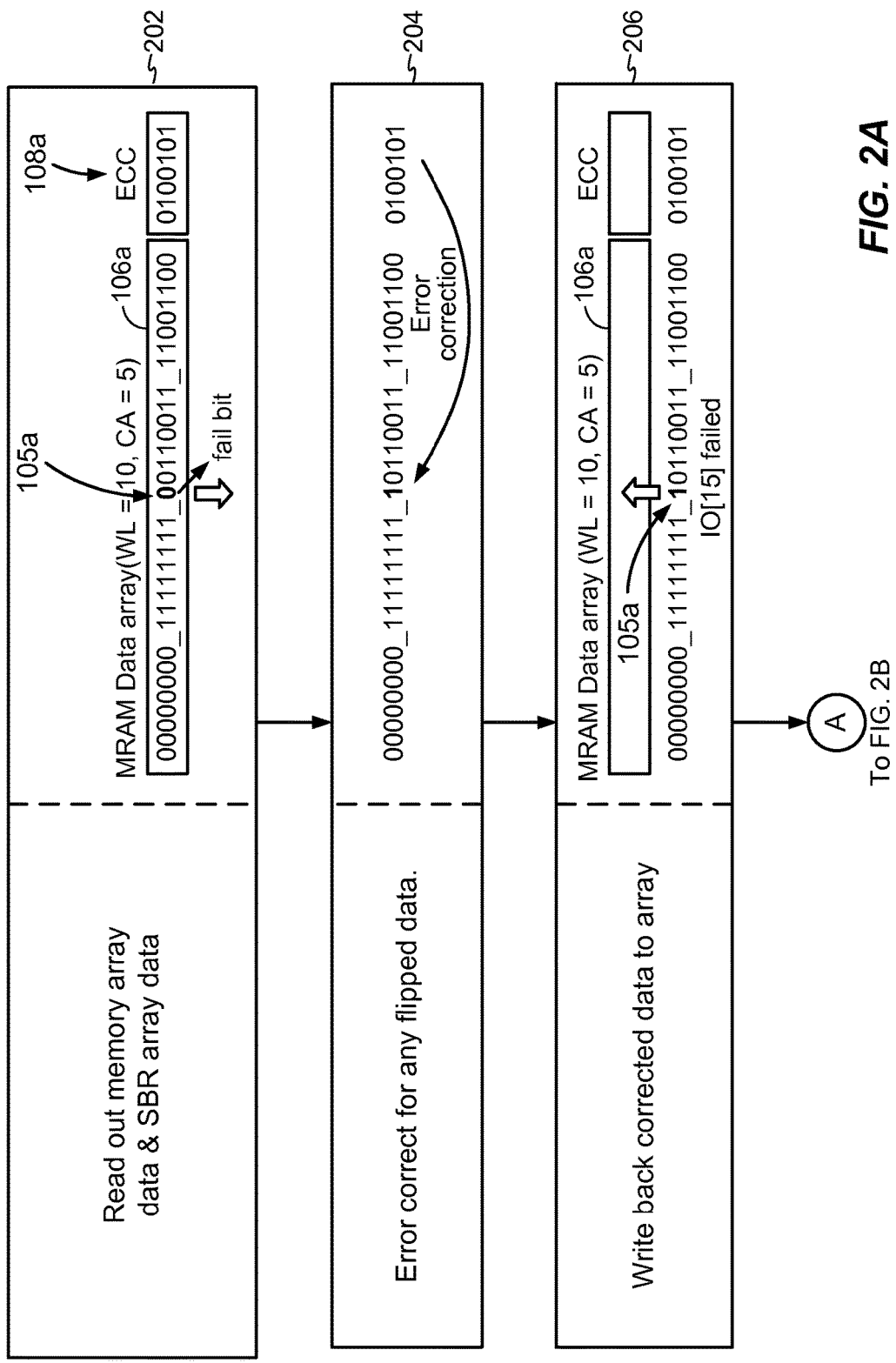
FIGS. 2A-D illustrate read operations with simultaneous failed bit repair when failed bit indications relate to whether or not failed bits must be flipped.
Figure 2B:
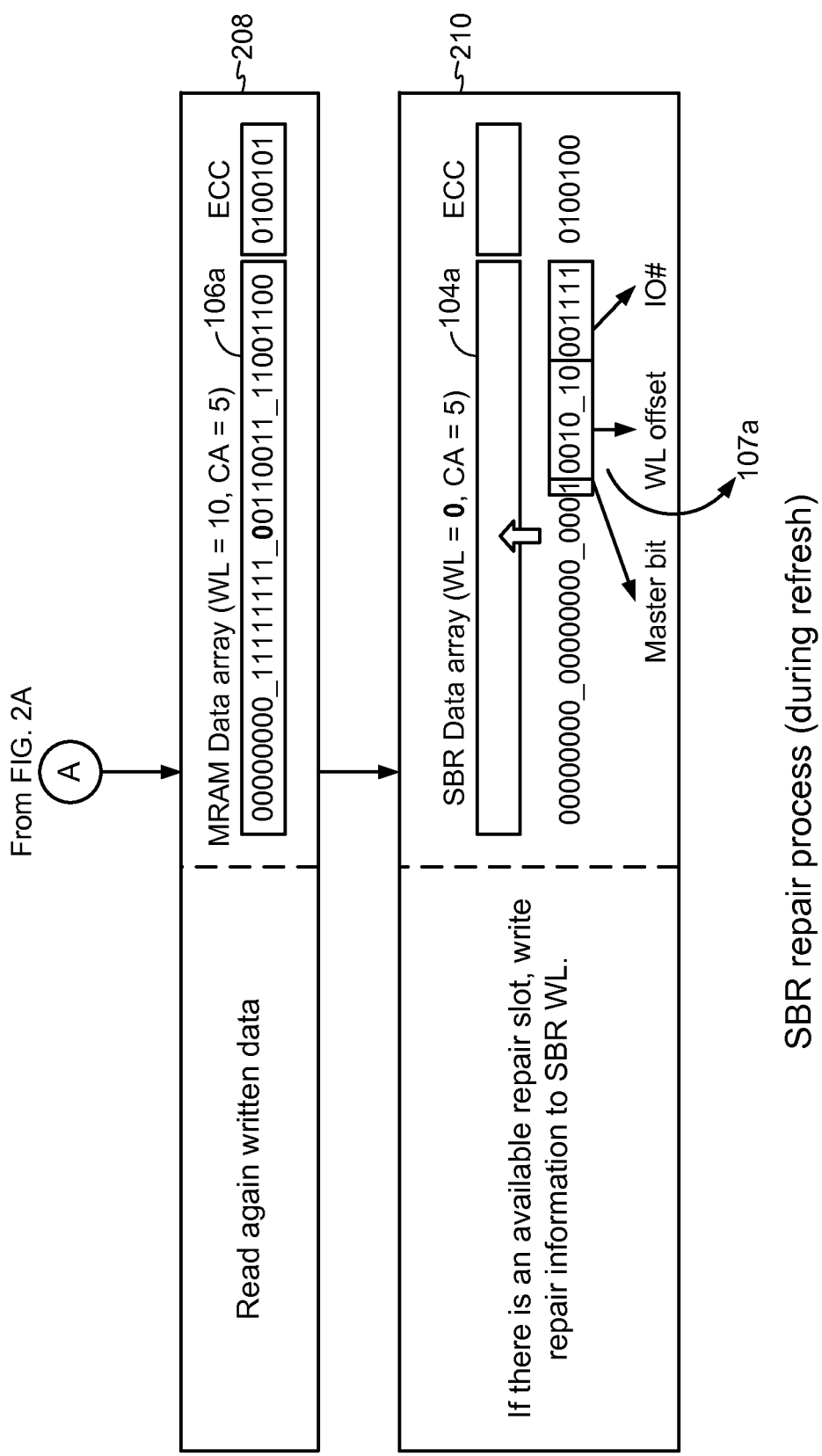

With reference to FIGS. 2A-B, an initial set of setup operations for populating SBR arrays according to exemplary embodiments is illustrated. FIGS. 2A-B include a flow diagram comprising a sequence of steps that may be performed during an exemplary refresh or data scrub process. While exemplary aspects relate to nonvolatile memory such as MRAM which do not require a refresh operation such as commonly seen in volatile memory, such as, dynamic random access memory (DRAM), a similar operation may nevertheless be performed periodically to determine failures. For example, during an initial setup phase and in periodic cycles, each row of first and second banks 102a-b may be read out, correctness of data stored therein, verified using corresponding ECC bits 108a-b, and then written back. Soft failures may be fixed during this refresh-like data scrubbing operations, whereas, hard failures may be flagged for repair handling according to exemplary embodiments. It will also be understood that the refresh/failure detection operations described in this context need not be performed only during an initial or periodic refresh process, but on the other hand, failure detection and repair handling can also be done as part of a memory access, such as, read or write operation.

In more detail, in step or block 202, during a refresh/data scrub or read operation, the aforementioned row 106a is read out. Using corresponding ECC bits from the ECC block 108a, row 106a is checked for correctness. Example values stored in row 106a are indicated in FIGS. 2A-B. In this running example, it is detected that bit 105a is incorrect, and deviates from its expected value, which is indicated by a pointer to bit 105a within the remaining bits of row 106a. However, this deviation alone is insufficient to determine whether the error is caused by a soft failure, which can be corrected by write back, or a hard failure, which needs further attention, for example, by creation of an entry in first SBR array 104a.

Thus, the process proceeds to block 204, where, error correction is performed to bit 105a (which, in a binary representation, amounts to inverting or flipping bit 105a from the erroneous value), and in block 206, row 106a is written back into first bank 102a with bit 105a flipped/corrected, with the hope that the error was a soft failure which would be corrected by rewriting the correct value.

In block 208 (commencing on FIG. 2B), row 106a is read out once again, to determine whether the error was fixed in block 206. For purposes of explaining the embodiments, it will be assumed that bit 105a had experienced a hard failure which would not have been fixed by rewriting the correct value in block 206. Accordingly, it is realized in block 208 that bit 205a is a failed bit, with a hard failure, such as, an MgO barrier breakdown of the MTJ cell located at bit 205a, which cannot be fixed by rewriting the correct value. It will be appreciated that in some cases, such hard failures need not be permanent, and it is possible that over time, the hard failure may become fixed based on any number of factors, which will not be discussed in this disclosure. In order to account for such situations, the previously described valid bit will be used to ensure that entries in the SBR arrays point to currently existing hard failures.

Accordingly, moving to block 210, the hard failure in bit 105a is memorialized in first SBR array 104a, with the assumption that first SBR array 104a has available storage space for storing an indication for failed bit 105a. While the exemplary SBR arrays, for example, first SBR array 104a, are capable of holding more failure indications than conventional techniques, it is recognized that these exemplary SBR arrays are nevertheless limited in capacity (e.g., 8 rows of 32-bit capacity, which offers storage space for one or more failed bit indications in each row, in the current example). Thus, if the available capacity for storing failed bit indications is indicated, a suitable replacement policy may be adopted for overwriting existing entries and creating room for new entries. If some entries contain invalid entries, as indicated by their valid bit fields, these may be deleted. If all entries are valid, then a replacement policy, such as, a least recently used (LRU) scheme in cache memory architectures, is one possible replacement policy, while skilled persons will recognize alternative replacement policies which may be employed within the scope of this disclosure.

With continuing reference to block 210, SBR array entry 107a is created in first SBR array 104a, wherein, a valid field may be set, and a word line offset field may pertain to failed row 106a (e.g., depicted as pertaining to word line (WL) ="10" in FIGS. 2A-B), and a column address may indicate the position of failed bit 105a within failed row 106a (e.g., depicted as pertaining to column address (CA)=5 in FIGS. 2A-B). More specifically, with this format, if SBR array entry 107a has the valid field set, then the indication thereof is that the value of bit 105a must be flipped (e.g., bit 105a may be stuck at a value that is the opposite of its expected correct value due to the failure). Thus, at this stage, first SBR array 104a would have been populated with an indication that there is a hard failure for bit 105a in first bank 102a. Similarly, all other rows in both first and second banks 102a-b can be scrubbed and failures noted in first and second SBR arrays 104a-b respectively.

Figure 2C:
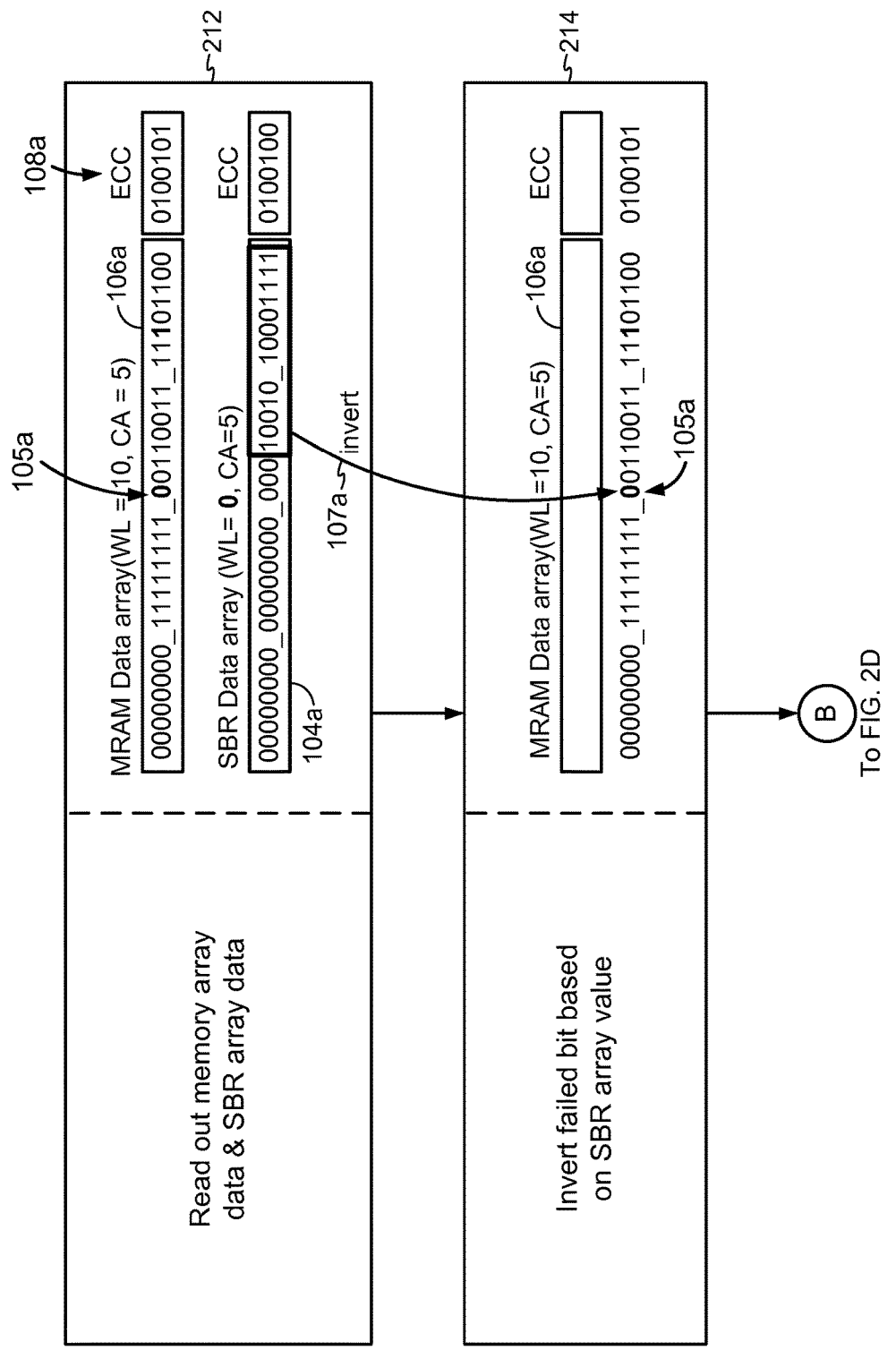
Figure 2D:
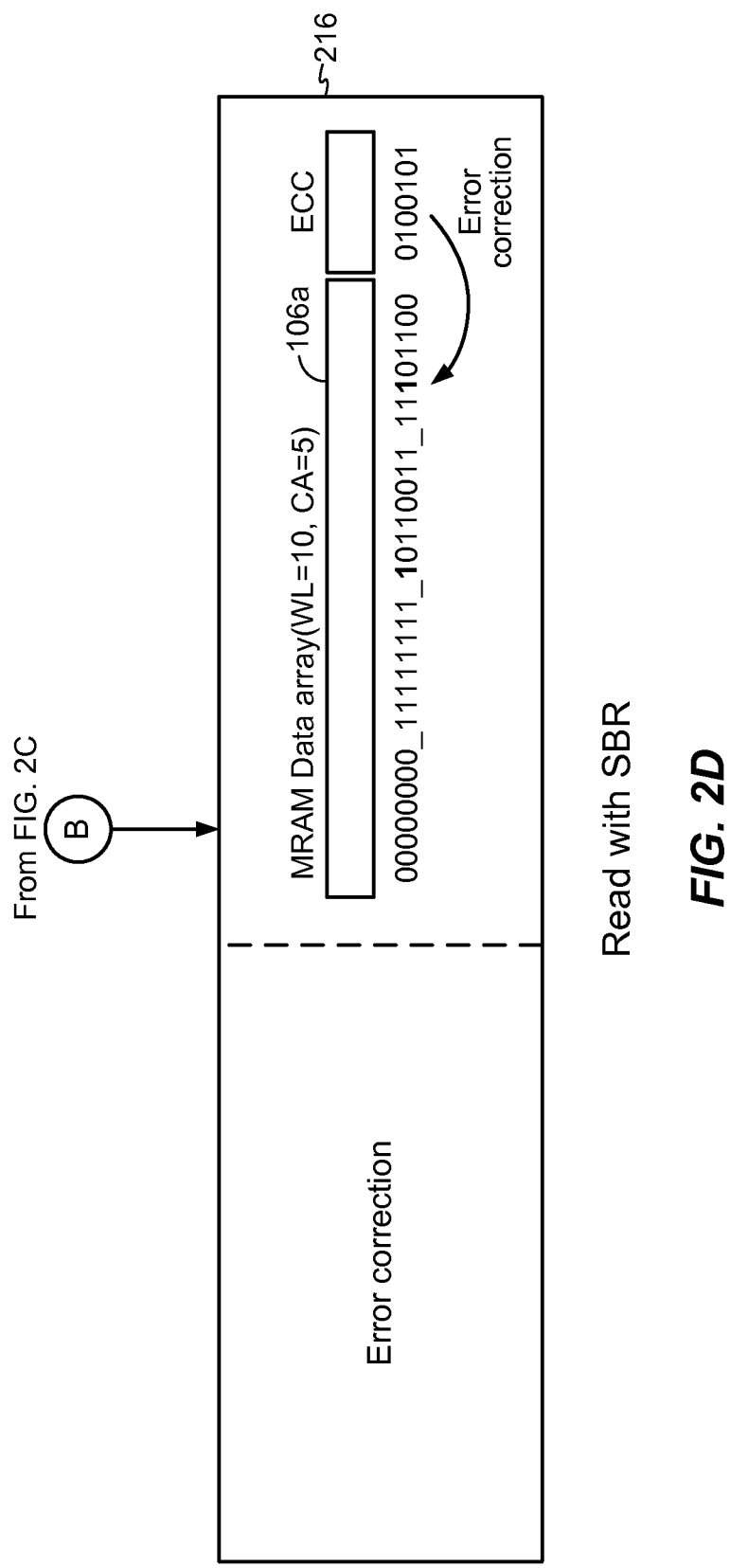

Referring to FIGS. 2C-D, an operation flow of similar format as FIGS. 2A-B is illustrated for an exemplary read operation, as will now be described with continuing reference to row 106a of first bank 102a. For example, with combined reference to FIG. 1, address command 110 may be received for performing a read on row 106a, to generate a desired output DOUT 112a [63:32]. Accordingly, global control block 116 will initiate a read operation on row 106a of first bank 102a, simultaneously with reading out first SBR array 104a. In some aspects, based on the received read address, global control block 116 will be able to determine that an entry in first SBR array 104a, SBR array entry 107a, exists for row 106a.

Thus, in block 212, the read operation on row 106a will be initiated by reading out row 106a from first bank 102a, while simultaneously reading out corresponding SBR array entry 107a from first SBR array 104a. It will be determined that there is a failure in bit 105a.

In block 214, the value read out of row 106a is modified or inverted by flipping failed bit 105a based on the valid bit being set in SBR array entry 107a. In some cases, the value stored in SBR array entry 107a may also be first checked against its own ECC bits (as shown in block 212 for first SBR array 104a) to ensure that the SBR array entries themselves have not been corrupted.

Returning to block 212, additional aspects are shown, which may be optional features and need not affect the above description in blocks 212 and 214 in all cases. Specifically, in block 212, the ECC bits may have indicated an error in an additional bit, other than bit 105a, within row 106a. This second error may have been caused by a soft failure or a hard failure since the entry in first SBR array 104a was created for row 106a in block 210 of FIG. 2B. Thus, in block 216 (shown in FIG. 2D), a correction of this second erroneous bit may also be performed while reading out row 106a, before finally outputting the correct value on DOUT 112a [63:32].

Figure 2E:
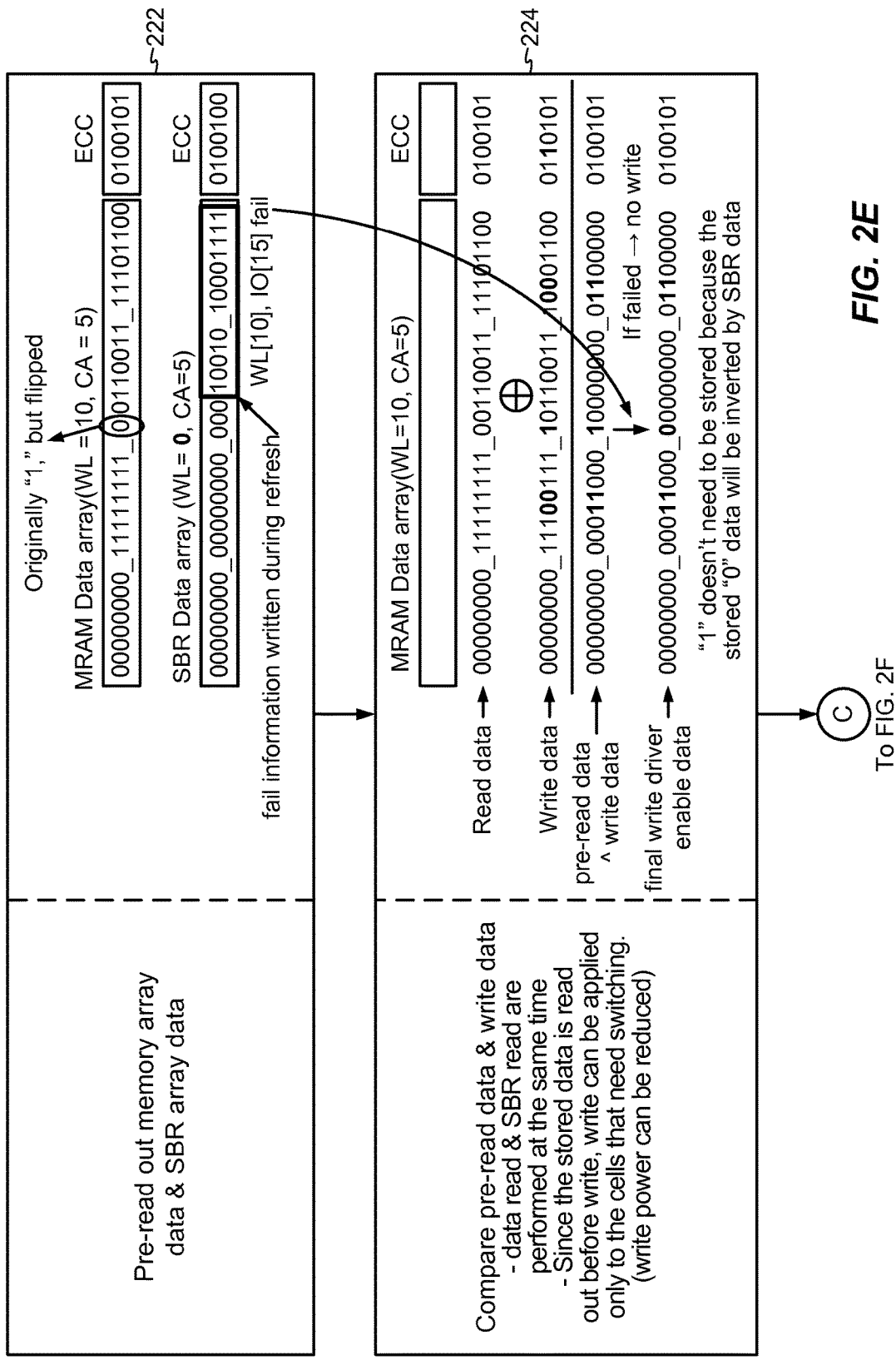
FIGS. 2E-H illustrate write operations with simultaneous failed bit repair when failed bit indications relate to whether or not failed bits must be flipped.
Figure 2F:
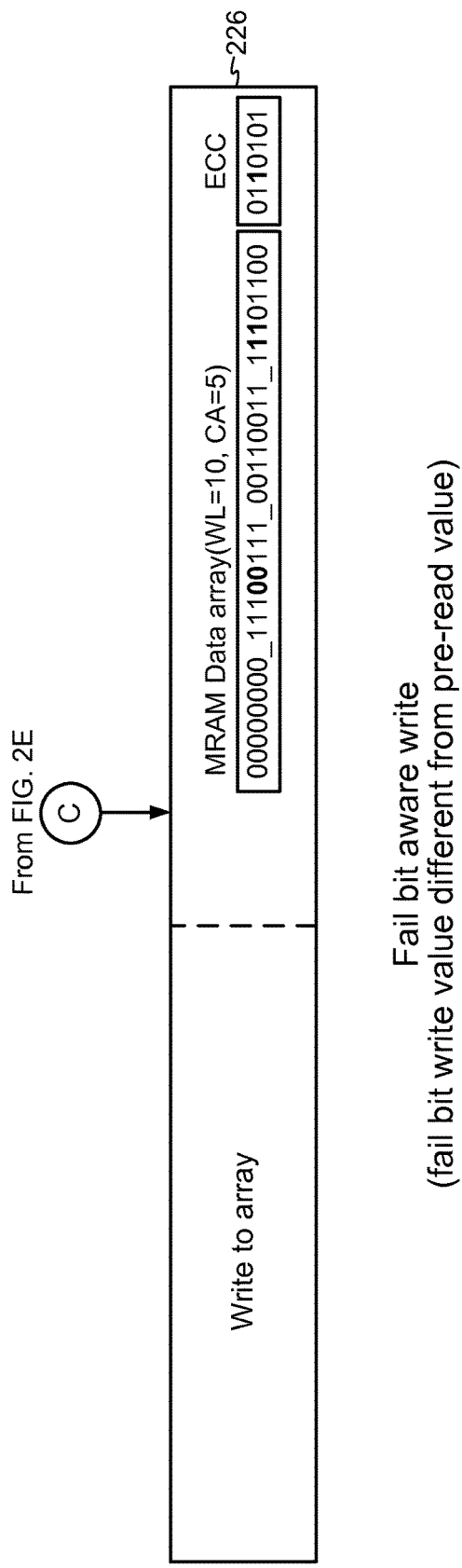

Turning now to FIGS. 2E-F, a first flavor of an exemplary write operation, where a new word or a new row, such as, a new first row is written to an existing first row of first bank 102a, is illustrated. For example, a new first row value received from DIN 111a [63:32] is to be written to existing first row, row 106a, for example, by the assistance of LDP 118a. This flavor pertains to a case where the purported new write value to bit 105a is the same as the currently stored value of failed bit 105a, which will be further explained below. Once again, when address command 110 indicates that a write operation is desired, global control block 116, for example, will indicate that SBR array entry 107a in first SBR array 104a exists for row 106a. Following this, the write process proceeds to block 222.

In block 222, a pre-read is performed on row 106a, where row 106a is first read out prior to writing a new value to row 106a. SBR array entry 107a from first SBR array 104a is also read out to determine which bit of row 106a has a failure indication. Once again, SBR array entry 107a itself may be first tested for correctness using ECC bits for first SBR array 104a.

Next, in block 224, the data to be written to row 106a can be compared to the data already present in row 106a, in order to only selectively write back bits that need to be modified according to the data coming in from DIN 111a [63:32], for example. As some of the 32-bits already present in row 106a are likely to be common to the new 32-bits to be written, it is advantageous to save on write power to those bit values that would remain unmodified from their existing values. The selective write of only the modified bits can be accomplished by performing a bit-wise XOR function on the existing bits in row 106a available from the pre-read, and the corresponding bits to be written to row 106a for the write operation.

However, unlike the remaining bits in row 106a, the failed bit 105a need not be re-written, if after re-writing, the bit would be inverted or flipped based on the indication in failed address 107a. In a numerical explanation to clarify this process, it will be assumed that the valid bit in SBR array entry 107a indicates that bit 105a needs to be flipped, where the value of bit 105a is currently at an erroneous value of "0." Thus, the current indication stored in SBR array entry 107a translates to the requirement that the correct value of bit 105a is "1." Thus, if a value of "1" is to be written to bit 105a pursuant to completion of the desired write operation, then this can be accomplished by letting the value remain at its nascent pre-read value of "0," so that when bit 105a is read out, it will be flipped by the indication in failed address 107a.

In block 226 (see FIG. 2F), the bits which are determined as different from the existing bits in row 106a, i.e., bits which need to be written, other than bit 105a, as the case may be based on block 224, are written back into row 106a to complete the write process. The corresponding ECC bits are updated based on the updated value in row 106a pursuant to the completion of the write operation.

In some cases, it will be understood that block 224 can be omitted, and block 226 can be modified to overwrite the entire 32-bits of new data bits arriving from DIN 111a [63:32] to row 106a. While this may not accomplish the same power savings that may be seen by avoiding write power to needlessly write bits which do not need to be modified, as described in blocks 224 and 226 above, overwriting the entire 32-bits can trade-off power savings for the added simplicity and cost savings (e.g., bit-wise XOR logic may be avoided). If the entire 32-bits of new data are overwritten in row 106a, a following refresh operation (e.g., per FIGS. 2A-B) may be performed to update first SBR array 104a accordingly.

Figure 2G:
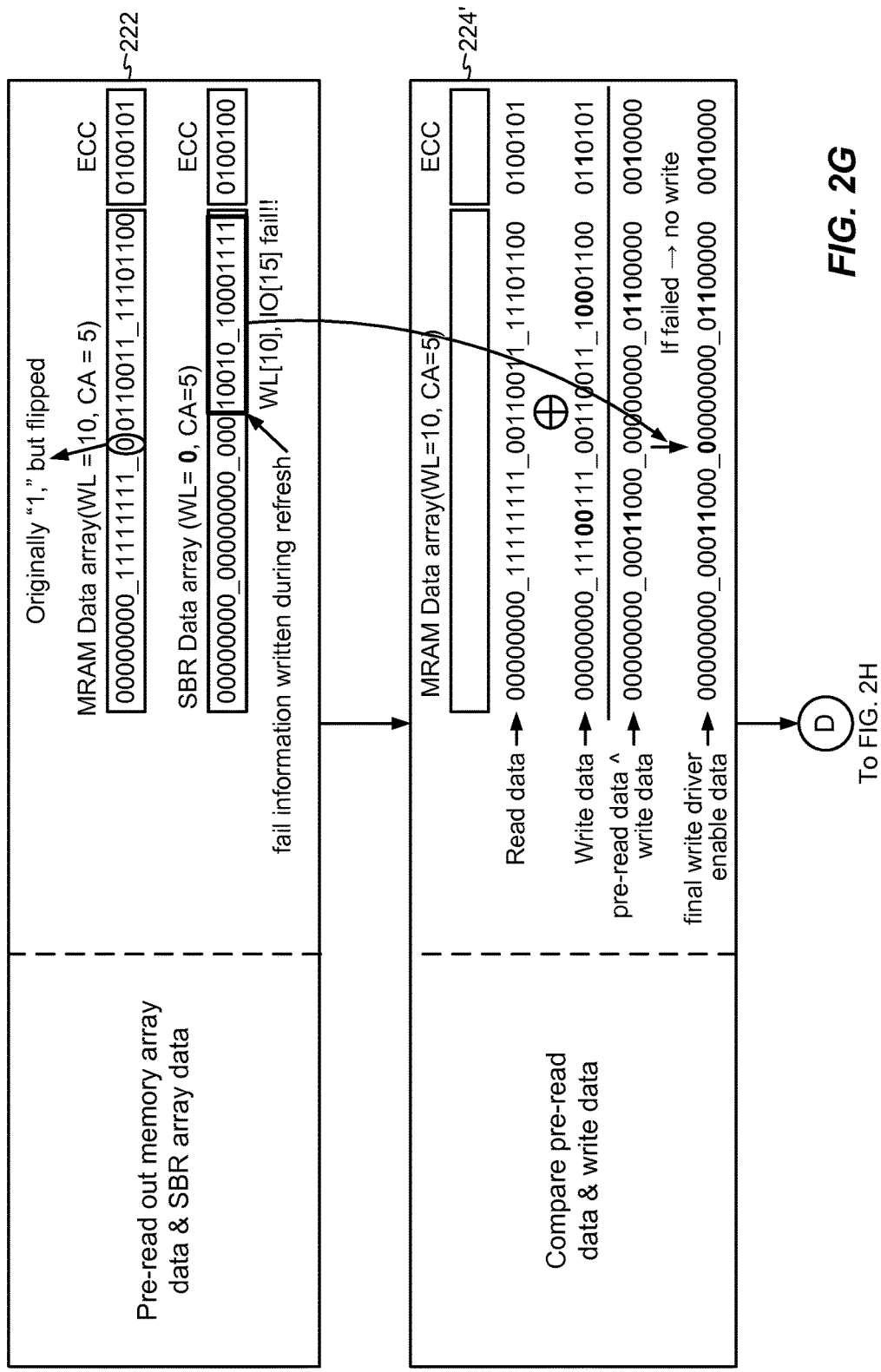
Figure 2H:
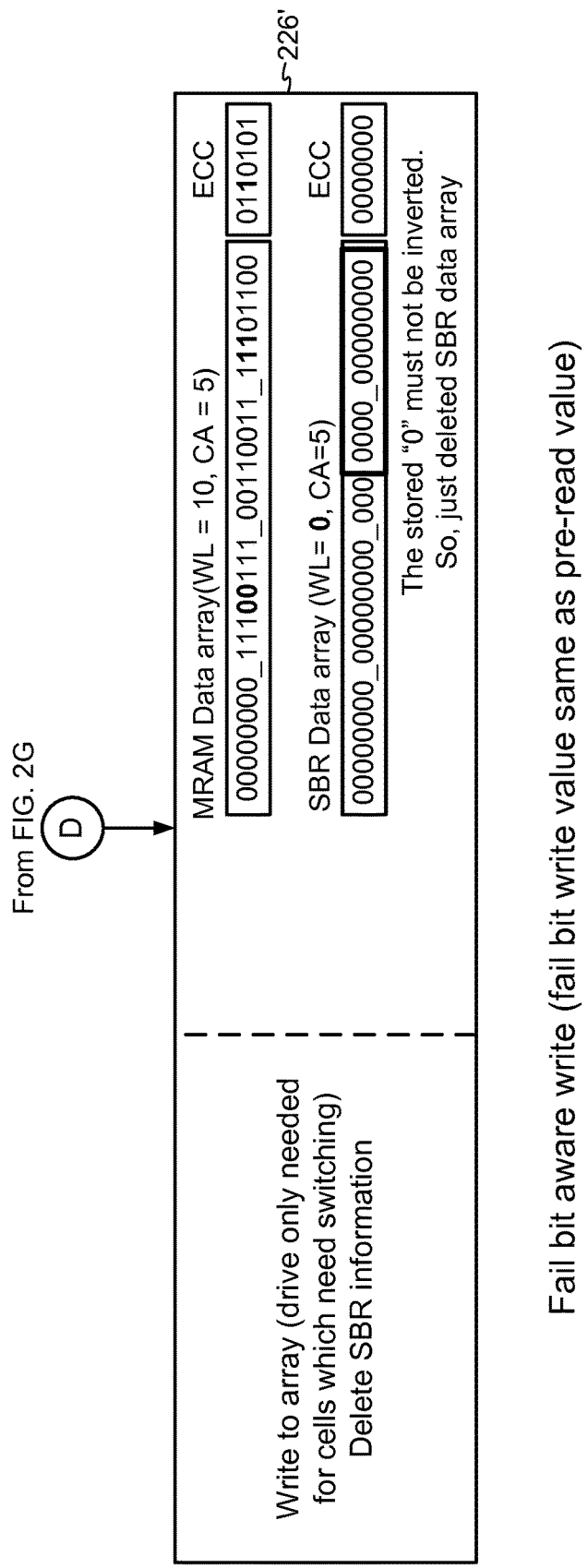

With reference now to FIGS. 2G-H, a second flavor of the write operation described in FIGS. 2E-F is illustrated, where the purported new write value to bit 105a is the same as the pre-read value of fail bit 105a. FIGS. 2G-H differ significantly from FIGS. 2E-F only in blocks 224 and 226 of FIGS. 2E-F, and thus, these differences have been denoted by labeling the corresponding blocks as 224' and 226' in FIGS. 2G-H. Since FIGS. 2G-H are substantially similar to FIGS. 2E-H in all other aspects, the description will not dwell on these similarities, but rather focus on the differences.

More specifically, FIGS. 2G-H represent an example where the write data includes a value in the position corresponding to bit 105a, which is the same as the value of bit 105a, read out from the pre-read of row 106a in block 222. However, it is known that bit 105a has the valid bit set in SBR array entry 107a, denoting that bit 105a needs to be flipped. Thus, in the numerical example, if bit 105a is read out of row 106a as value "0," it is known that its expected value is "1," since the read value of "0" is false. However, if the new write were to have a value of "0" to write to bit 105a, then "0" would be the correct value at bit 105a, and thus should not be flipped based on the valid bit being set in SBR array entry 107a. Accordingly, the indication of error in bit 105a corresponding to value "0" must be removed.

Thus, the process of writing data to row 106a in FIGS. 2E-H differs from that described above in FIG. 2E-F, in that, in block 224' of FIG. 2D, it is seen that the data value to be written to bit 105a is the same as the data value read out of bit 105a, but which has been previously noted as an erroneous value by the valid bit being set in SBR array entry 107a. Accordingly, no overwrite needs to be performed at bit 105a pursuant to the write operation, as the purported value already matches the value read out of row 106a. Similar to block 224 of FIG. 2C, all other bits which would be modified from their currently stored value can be updated for purposes of the write operation in block 224' (keeping in mind, once again, that in alternative embodiments, block 224' may be avoided by trading off power and writing all bits of DIN 111a [63:32] to row 106a and updating first SBR array 104a as needed).

Thus, in block 226' (as depicted in FIG. 2H), if the write value to bit 105a matches the pre-read value of bit 105a, then SBR array entry 107a can be deleted, or invalidated, based on resetting the valid bit.

With reference now to FIGS. 3A-H, alternative embodiments are depicted, wherein, the format of entries in exemplary SBR arrays differ from those described above with regard to FIGS. 2A-H. Significantly, one or more entries in exemplary SBR arrays according to these alternative embodiments of FIGS. 3A-H include an additional field, referred to as a "correct field," to indicate the correct value of the failed bit indicated by a failed address stored therein. In other words, rather than indicate that a failed bit must be flipped or not, based on a valid bit as in previously described embodiments, the SBR array entries of alternative embodiments herein, explicitly store the correct value which must be present at the identified failed bit. Accordingly, in these alternative embodiments, an entry of first SBR array 104a, such as, SBR array entry 107'a (not illustrated separately), includes a failed address corresponding to failed bit 105a, where failed address 107'a includes fields for a valid bit and failed IO number as before, and additionally, also includes a write data bit field which indicates the correct data bit value. Thus, if SBR array entry 107'a indicates a valid entry, then the correct value of bit 105a is provided by the write data bit field. The alternative embodiments are substantially similar in other regards to those previously described, and accordingly, the following description will focus on the differences, while omitting a repetition of similar aspects.

Figure 3A:
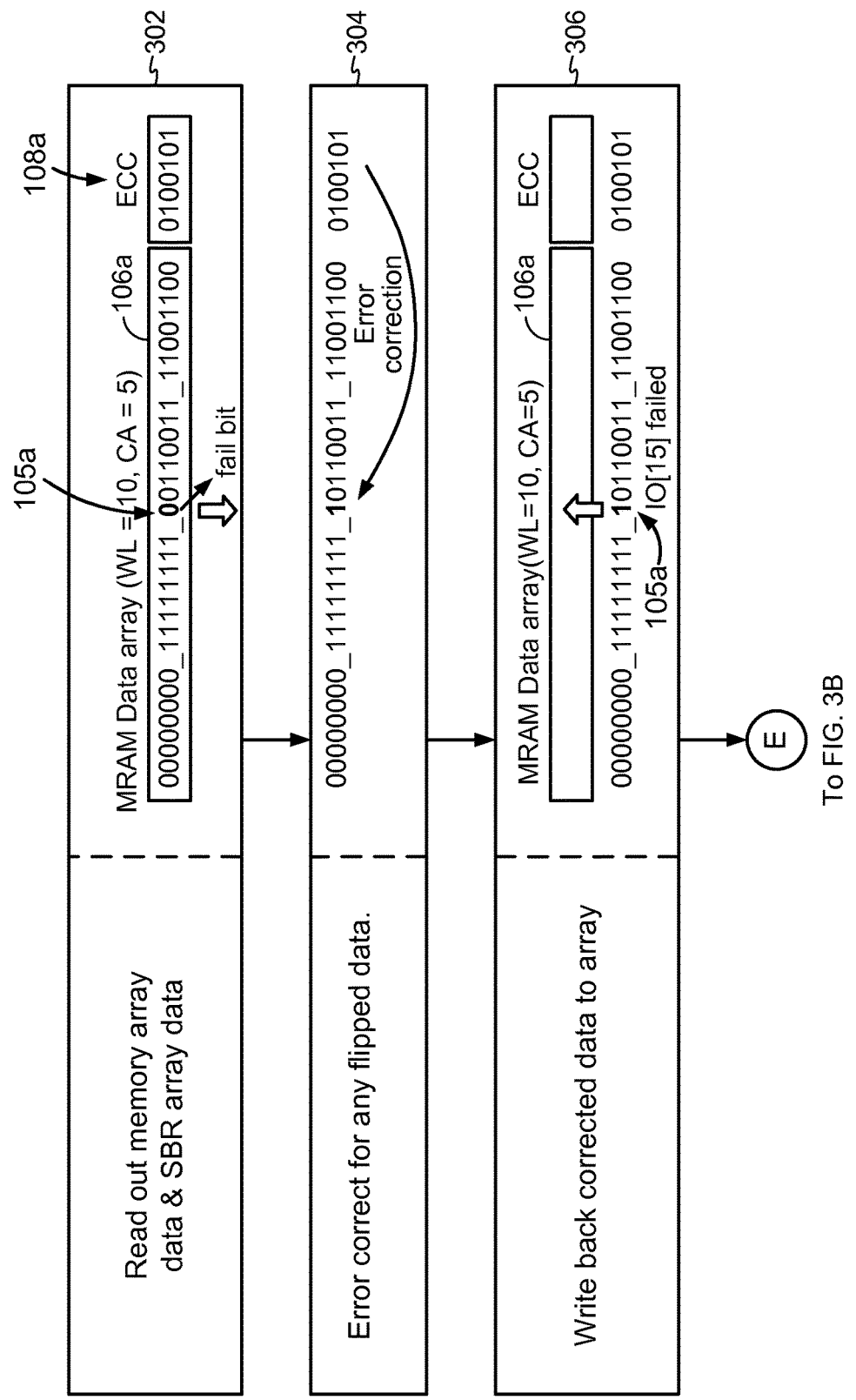
FIGS. 3A-D illustrate read operations with simultaneous failed bit repair when failed bit indications include correct values of failed bits.
Figure 3B:
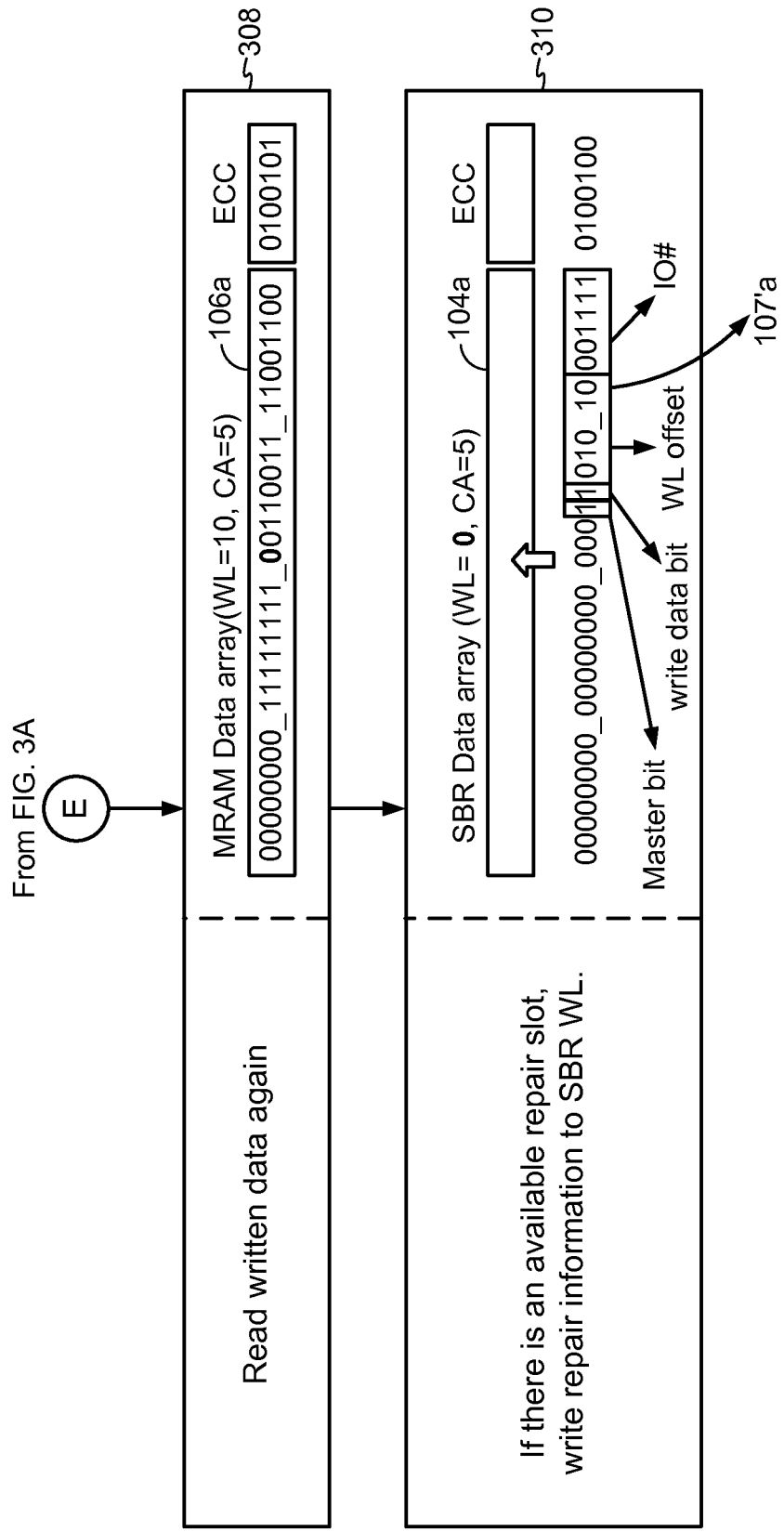

In more detail, blocks 302-308 of FIGS. 3A-B pertaining to the initial setup or refresh operations for populating exemplary SBR arrays are substantially similar to blocks 202-208 of FIGS. 2A-B. The significant difference lies in block 310, where unlike block 210 of FIG. 2B, the correct value of failed bit 105a is written to the entry created for SBR array entry 107'a in its write data bit field.

Figure 3C:
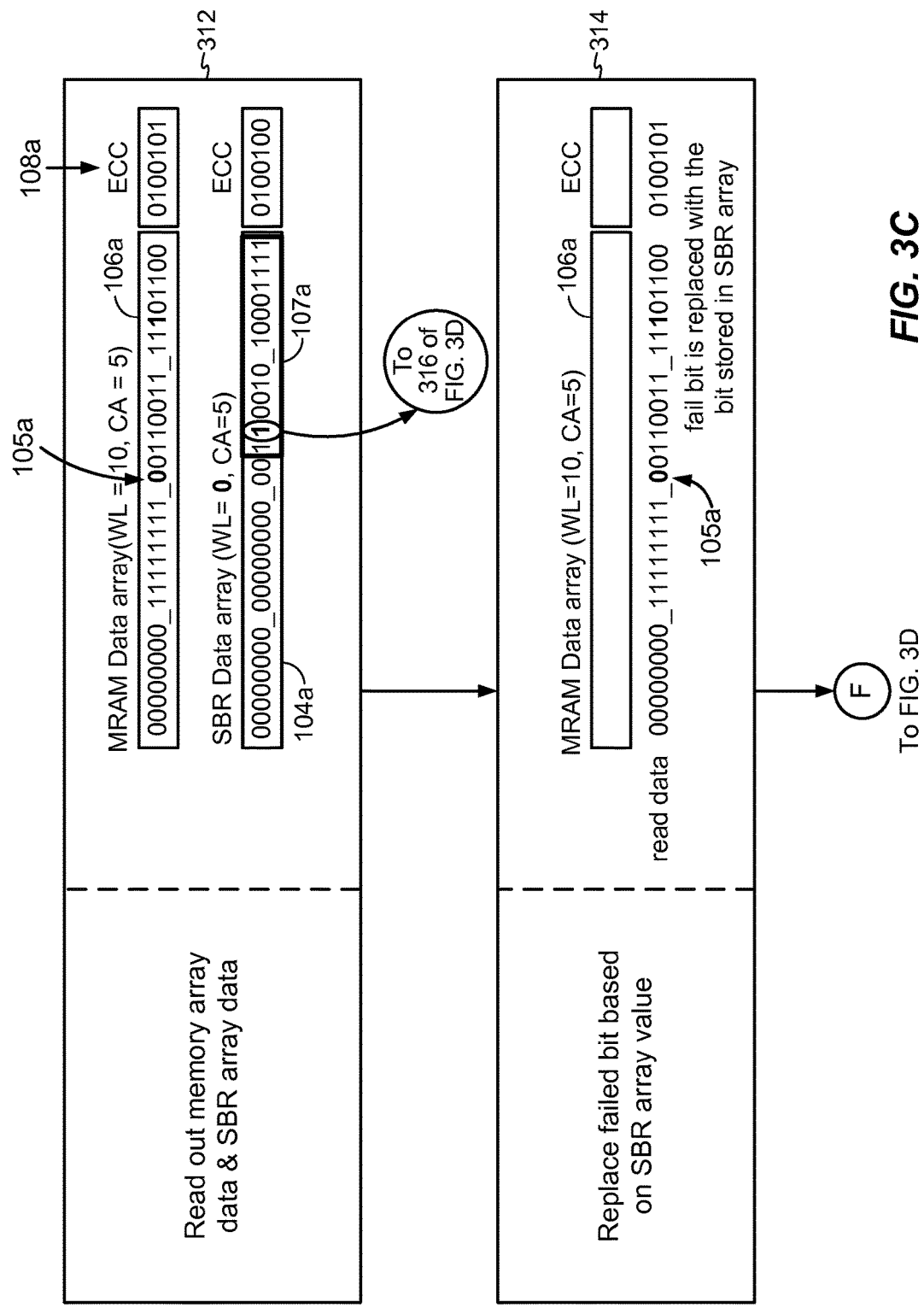
Figure 3D:
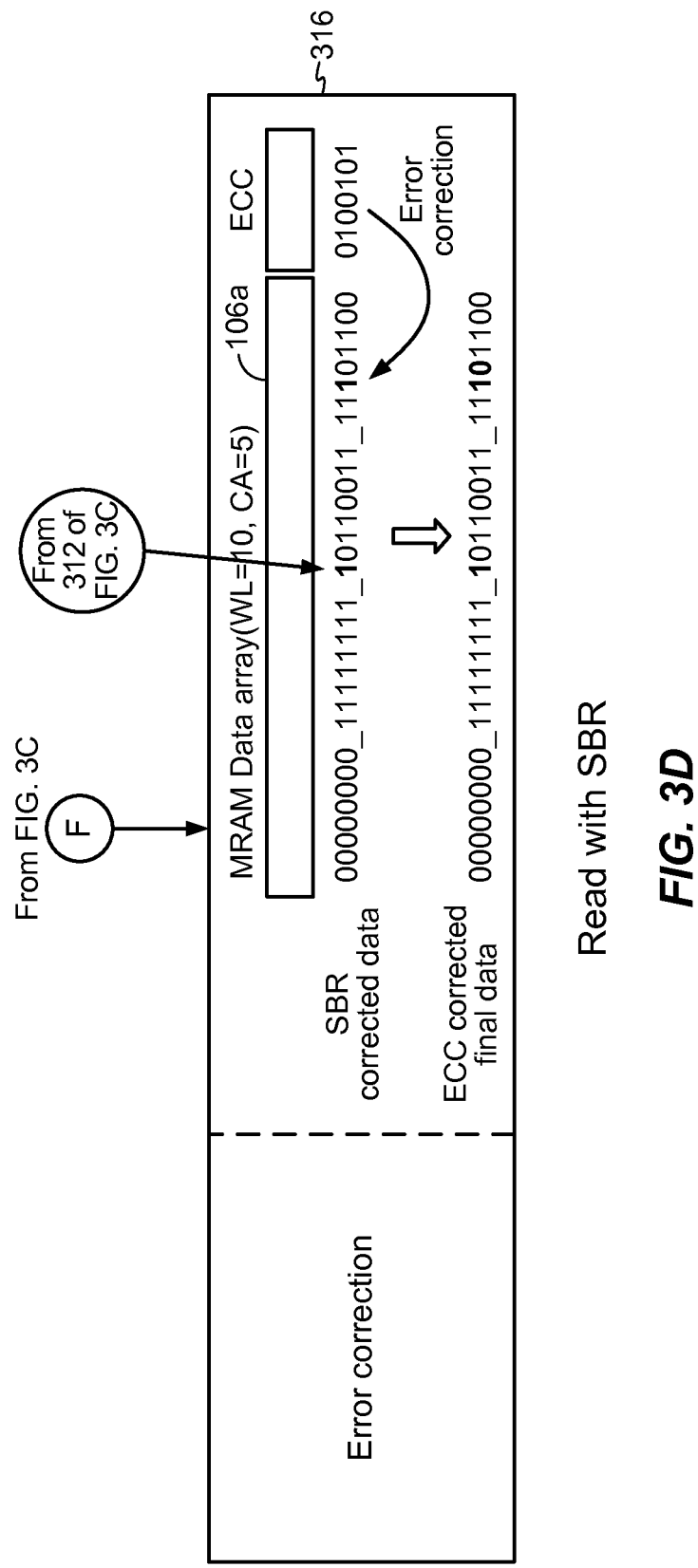

With the above differences in mind, a description of a read operation on failed row 106a with failed bit 105a indication as per SBR array entry 107'a above, with reference to FIGS. 3C-D will now be undertaken, where, blocks 312-316 are similar in many aspects to blocks 212-216 of FIGS. 2C-D. In block 312, SBR array entry 107'a is read out with its additional field indicating the correct value of failed bit 105a, along with the read out of row 106a.

Unlike the flipping operation discussed in block 214 of FIG. 2C, in block 314 of FIG. 3C, the read out value of row 106a is modified by replacing failed bit 105a with its correct value derived from the write data value field of SBR array entry 107'a.

Similar to block 216 of FIG. 2D, error checks are performed in block 316 of FIG. 3D, and additional corrections, as needed are performed based on the ECC bits, prior to outputting the corrected data on DOUT 112a [63:32].

With reference now to FIGS. 3E-H, first and second flavors for write operations to row 106a based on whether or not the fail bit pre-read value is different from the purported new write value are respectively illustrated. However, unlike the differences amongst FIGS. 2E-F and FIGS. G-H, there is practically no difference amongst FIGS. 3E-F and FIGS. 3G-H, because the correct value of the failed bit 105a is available from SBR array entry 107'a, and thus, there is no need to include special care for whether or not the fail bit pre-read value is different from the purported new write value.

Figure 3E:
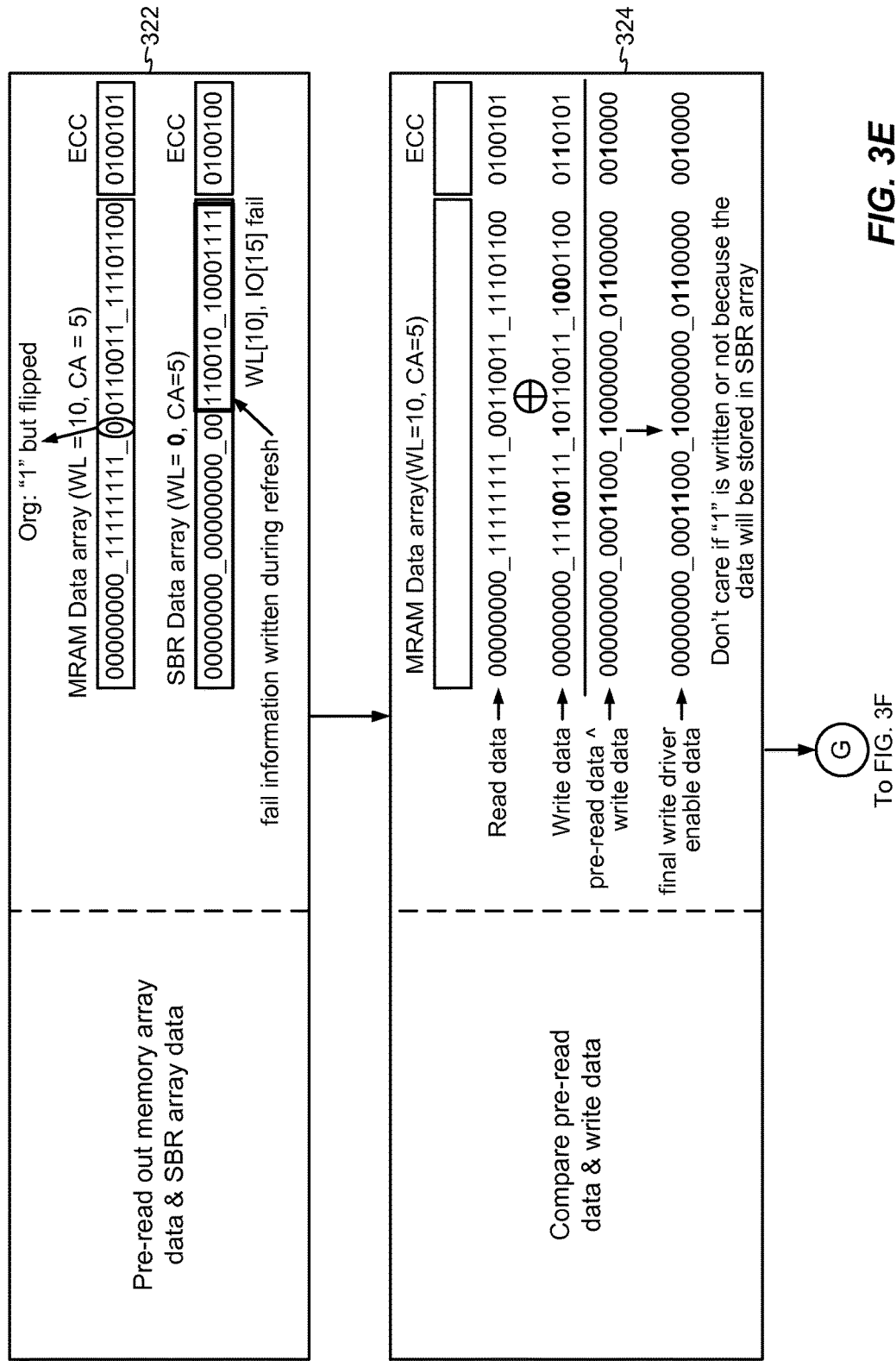
FIGS. 3E-H illustrate write operations with simultaneous failed bit repair when failed bit indications include correct values of failed bits.
Figure 3F:
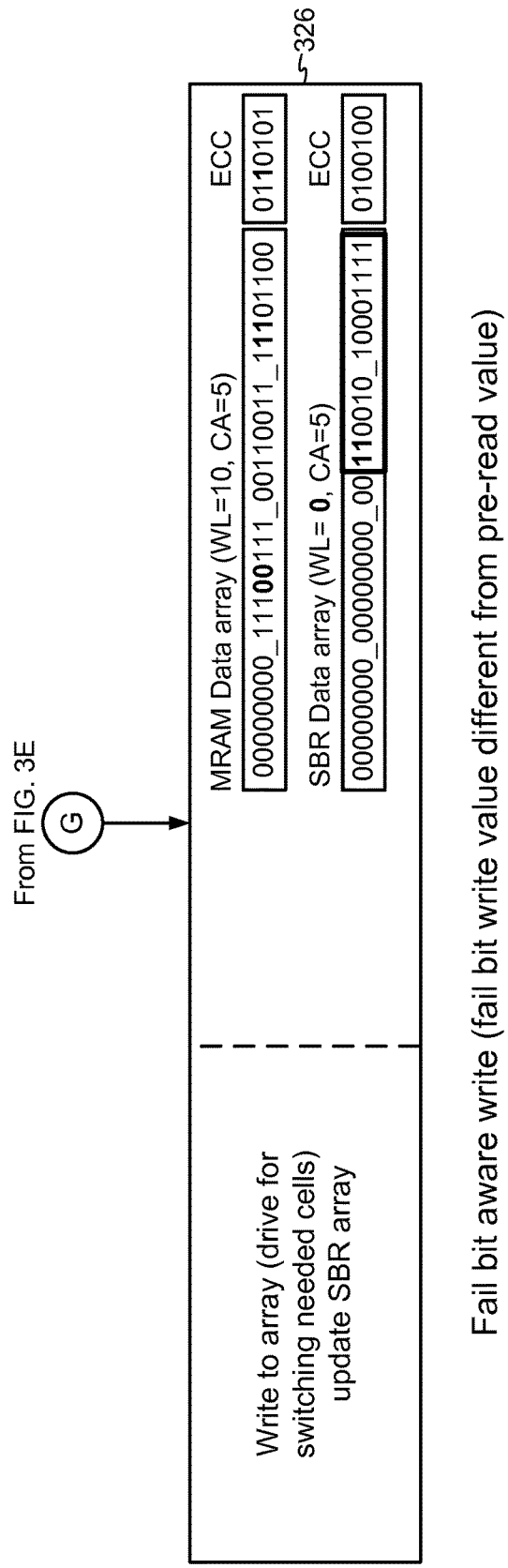
Figure 3G:
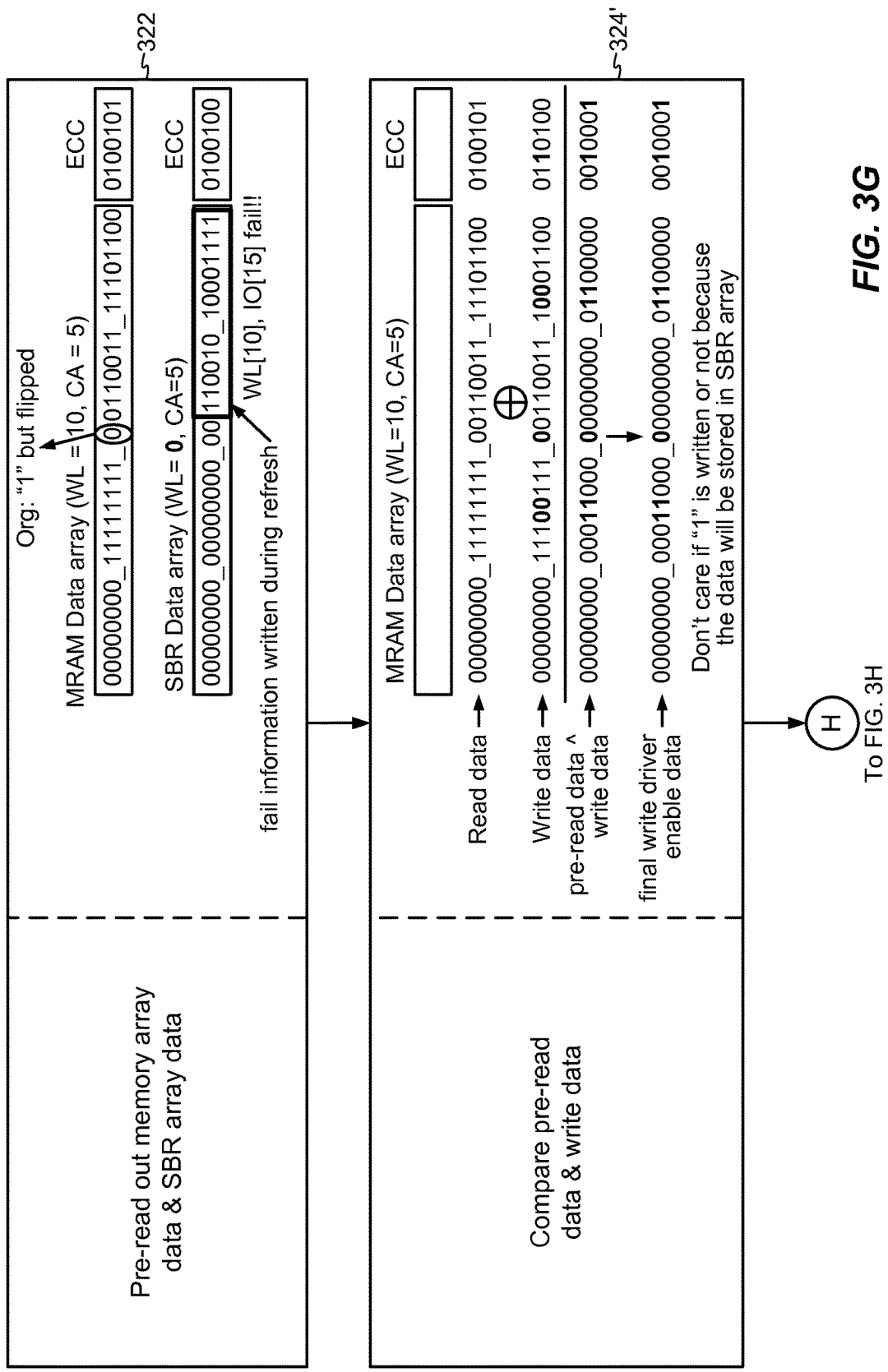
Figure 3H:
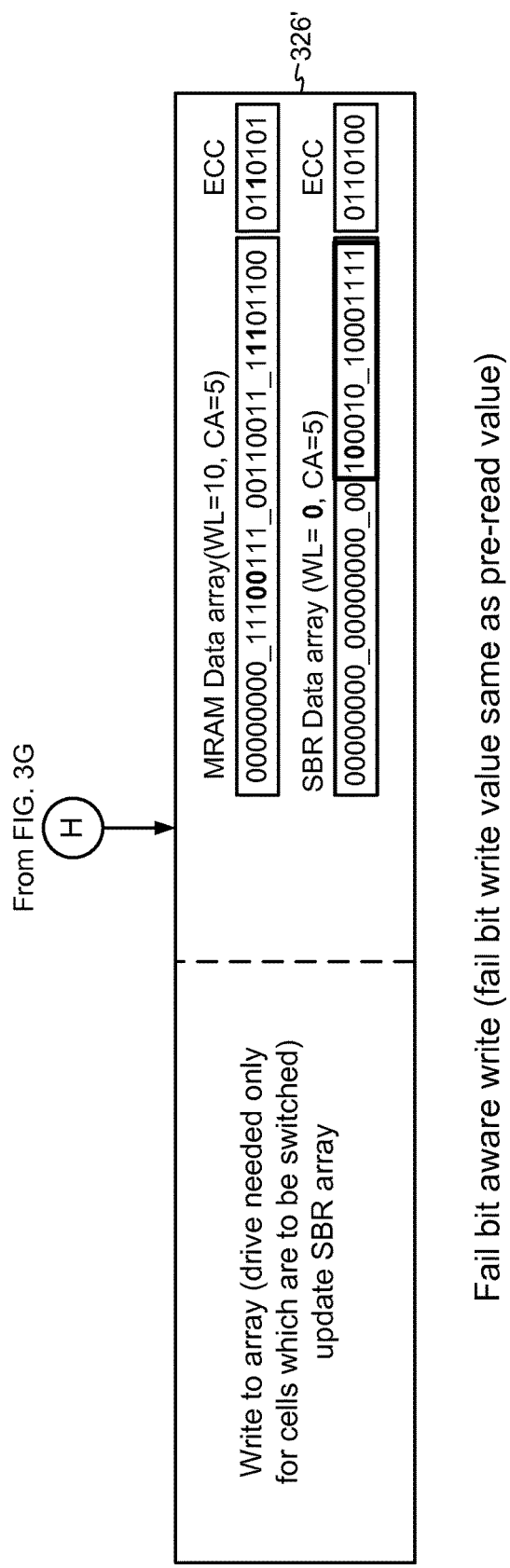

In more detail, blocks 322 of FIGS. 3E, 3G and blocks 222 of FIGS. 2E, 2G are similar, where pre-read is performed on row 106a, where row 106a is first read out, prior to writing a new value to row 106a. However, in both block 324 of FIG. 3E, where the purported new write value to failed bit 105a is different from the pre-read value of failed bit 105a, and in block 324' of FIG. 3G, where the purported new write value to failed bit 105*a* is different from the pre-read value of failed bit 105*a*, it does not matter whether the purported new write value is written to bit 105*a* or not, in row 106*a*. This is because the correct value would anyway be updated in the write data value bit field of failed address 107'*a* in both block 326 of FIG. 3F, as well as, block 326' of FIG. 3H.

Once again, it will be understood that in alternative implementations, other than those depicted in blocks 324 and 324', for example, it is possible to write the entire row 106*a* with the new write value, rather than only the bits which are different from the previously stored bits, to trade off power savings for design simplicity.

Figure 4:
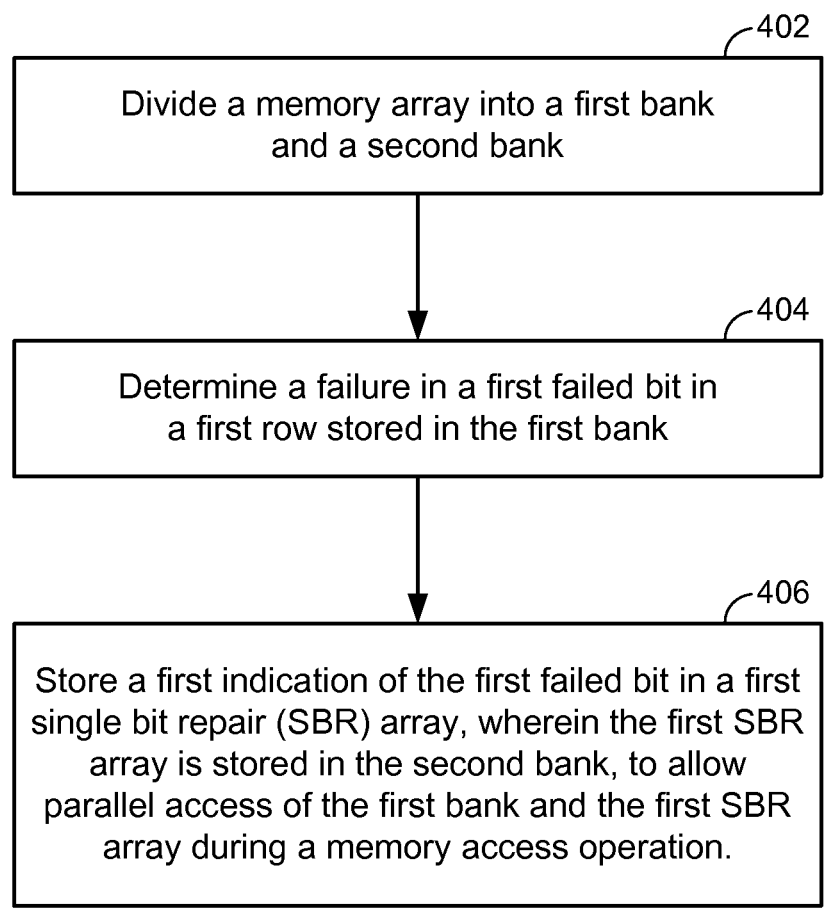
FIG. 4 is a flow chart depiction of an exemplary method of correcting bit failures in a memory array according to aspects of this disclosure.

It will be appreciated that embodiments include various methods for performing the processes, functions and/or algorithms disclosed herein. For example, as illustrated in FIG. 4, an embodiment can include a method of correcting bit failures in a memory array (e.g., memory device 100), the method comprising: dividing the memory array into a first bank (e.g., first bank 102*a*) and a second bank (e.g., second bank 102*b*)—Block 402; determining a failure in a first failed bit (e.g., bit 105*a*) in a first row (e.g., first row 106*a*) stored in the first bank—Block 404; and storing a first indication (e.g., SBR array entry 107*a*) of the first failed bit in a first single bit repair (SBR) array (e.g., first SBR array 104*a*), wherein the first SBR array is stored in the second bank, to allow parallel access of the first bank and the first SBR array during a memory access operation—Block 406.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for failed bit repair in resistive memory devices. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of correcting a bit failure in a memory array, the method comprising:
   determining a failure in a first failed bit in a first row stored in a first bank of the memory array;
   storing a first address of the first failed bit in a first single bit repair (SBR) array;
   storing a valid field in the first SBR array for indicating that a value of the first failed bit at the first address is inverted due to the failure, wherein the first address is a full address of the first failed bit, wherein the first SBR array is stored in a second bank of the memory array, and wherein the first bank and the first SBR array are accessible in parallel;
   accessing the first row stored in the first bank and the first SBR array stored in the second bank in parallel; and
   correcting the failure in the first failed bit during a read operation for the first row or a refresh operation by inverting a bit value read out from the first row at the first address,
   wherein the first row stored in the first bank comprises an upper half or more significant bits of a data word and a second row stored in the second bank comprises a lower half or less significant bits of the data word.

2. The method of claim 1, wherein during a write operation of a new first row to the first row of the first bank:
   determining that the first SBR array comprises the first address of the first failed bit in the first row;
   reading out the first row stored in the first bank;
   comparing bit values of the new first row and the read out first row at a position of the first failed bit based on the first address;
   writing the new first row to the first bank; and
   updating the first SBR array based on the comparison.

3. The method of claim 2, further comprising, comparing all bits of the new first row and the read out first row, and selectively writing only bits of the new first row to the first bank, that are different from the read out first row.

4. The method of claim 1, wherein the first SBR array further comprises a correct field comprising a correct value of the first failed bit.

5. The method of claim 4, wherein correcting the failure in the first failed bit during a read operation for the first row or a refresh operation comprises:
   replacing a bit value read out from the first row with the correct value at the first address.

6. The method of claim 4, wherein during a write operation of a new first row to the first row of the first bank:
   determining that the first SBR array comprises the first address of the first failed bit in the first row;
   reading out the first row stored in the first bank;

comparing bit values of the new first row and the read out first row at a position of the first failed bit based on the first address;
writing the new first row to the first bank; and
updating the first SBR array based on the comparison.

7. The method of claim 4, further comprising, comparing all bits of the new first row and the read out first row, and selectively writing only bits of the new first row to the first bank, that are different from the read out first row.

8. The method of claim 1, wherein the memory array is an MRAM array and the failure comprises a hard failure corresponding to MgO breakdown of a barrier layer of a magnetic tunnel junction (MTJ) cell formed at the first failed bit.

9. The method of claim 1, further comprising storing a second address of a second failed bit of a second row of the second bank in a second SBR array, wherein the second SBR array is stored in the first bank, wherein the second row and the second SBR array are accessible in parallel during a read operation of the second row.

10. A memory device comprising:
a first memory bank;
a second memory bank; and
a first single bit repair (SBR) array stored in the second memory bank, the first SBR array configured to store a first address of a failure in a first failed bit in a first row of the first memory bank and a valid field to indicate that a value of the first failed bit is inverted at the first address, wherein the first address is a full address of the first failed bit, and wherein the first memory bank and the first SBR array are configured to be accessed in parallel; and
logic for correction of the first failed bit during a read operation for the first row or a refresh operation comprising logic to invert a bit value read out from the first row at the first address,
wherein the first row stored in the first memory bank comprises an upper half or more significant bits of a data word and a second row stored in the second memory bank comprises a lower half or less significant bits of the data word.

11. The memory device of claim 10, further comprising write logic configured to:
determine that the first SBR array comprises the first address of the first failed bit in the first row;
read out the first row stored in the first memory bank;
compare bit values of a new first row to be written and the read out first row at a position of the first failed bit based on the first address;
write the new first row to the first memory bank; and
update the first SBR array based on the comparison.

12. The memory device of claim 11, wherein the write logic is further configured to compare all bits of the new first row and the read out first row, and selectively write only bits of the new first row to the first bank, that are different from the read out first row.

13. The memory device of claim 10, wherein the first SBR array comprises a correct field comprising a correct value of the first failed bit.

14. The memory device of claim 13, further comprising read logic configured to:
replace a bit value read out from the first row with the correct value at the first address.

15. The memory device of claim 13, further comprising write logic configured to:
determine that the first SBR array comprises the first address of the first failed bit in the first row;
read out the first row stored in the first memory bank;
compare bit values of a new first row to be written and the read out first row at a position of the first failed bit based on the first address;
write the new first row to the first memory bank; and
update the first SBR array based on the comparison.

16. The memory device of claim 13, wherein the write logic is further configured to compare all bits of the new first row and the read out first row, and selectively write only bits of the new first row to the first bank, that are different from the read out first row.

17. The memory device of claim 10, wherein the memory device is an MRAM array and the failure comprises a hard failure corresponding to MgO breakdown of a barrier layer of a magnetic tunnel junction (MTJ) cell formed at the first failed bit.

18. The memory device of claim 10, further comprising a second SBR array stored in the first memory bank, the second SBR array configured to store a second address of second failed bit in a second row of the second memory bank, wherein the second memory bank and the second SBR array are configured to be accessed in parallel during a read operation of the second row.

19. A non-transitory computer-readable storage medium comprising code, which, when executed by a processor, causes the processor to perform operations for correcting bit failures in a memory array, the non-transitory computer-readable storage medium comprising:
code for determining a failure in a first failed bit in a first row stored in a first memory bank of the memory array; and
code for storing a first address of the first failed bit in a first single bit repair (SBR) array;
code for storing a valid field in the first SBR array for indicating that a value of the first failed bit at the first address is inverted due to the failure, wherein the first address is a full address of the first failed bit, wherein the first SBR array is stored in a second bank of the memory array, and wherein the first bank and the first SBR array are accessible in parallel;
code for accessing the first row stored in the first bank and the first SBR array stored in the second bank in parallel; and
code for correcting the failure in the first failed bit during a read operation for the first row or a refresh operation by inverting a bit value read out from the first row at the first address, wherein the first row stored in the first bank comprises an upper half or more significant bits of a data word and a second row stored in the second bank comprises a lower half or less significant bits of the data word.

* * * * *